United States Patent [19]

Mollet et al.

[11] Patent Number: 5,030,407
[45] Date of Patent: Jul. 9, 1991

[54] METHOD OF MAKING CARDS HAVING GRAPHICS ELEMENTS THEREON

[75] Inventors: Jean P. Mollet, La Celle Saint Cloud; René Rose, Voisin le Bretonneux, both of France

[73] Assignee: Schlumberger Industries, Montrouge, France

[21] Appl. No.: 341,183

[22] Filed: Apr. 21, 1989

[30] Foreign Application Priority Data

Apr. 28, 1988 [FR] France ................... 88 05671
Sep. 16, 1988 [FR] France ................... 88 12088

[51] Int. Cl.$^5$ ................... B29C 45/14; B29C 45/16
[52] U.S. Cl. ................... 264/261; 264/275
[58] Field of Search ............ 264/261, 272.11, 272.15, 264/272.17, 247, 275, 276, 277, 278, 279, 279.1; 235/492, 493; 425/517

[56] References Cited

U.S. PATENT DOCUMENTS

| | | | |
|---|---|---|---|
| 3,122,598 | 2/1964 | Berger | 264/247 |
| 3,469,310 | 9/1969 | Peck | 264/272.11 |
| 3,654,062 | 4/1972 | Loew | 264/247 |
| 3,839,129 | 10/1974 | Neumann | 264/247 |
| 4,216,577 | 8/1980 | Badet | 264/272.17 |
| 4,427,615 | 1/1984 | Eskesen | 264/278 |
| 4,450,024 | 5/1984 | Haghiri-Tehrani | 264/272.17 |
| 4,625,102 | 11/1986 | Rebjock | 425/517 |
| 4,737,620 | 4/1988 | Mollet | 235/492 |
| 4,779,145 | 10/1988 | Lemelson | 235/493 |
| 4,801,561 | 1/1989 | Sankhagowit | 264/272.11 |
| 4,812,633 | 3/1989 | Vogelgesang | 235/493 |
| 4,822,550 | 4/1989 | Komathu | 264/272.15 |

FOREIGN PATENT DOCUMENTS

| | | | |
|---|---|---|---|
| 1186003 | 4/1985 | Canada | 235/493 |
| 8614231 | 10/1986 | France . | |
| 8700446 | 7/1988 | France . | |

Primary Examiner—Jay H. Woo
Assistant Examiner—Jeremiah F. Durkin, II
Attorney, Agent, or Firm—Frishauf, Holtz, Goodman & Woodward

[57] ABSTRACT

A method of making a card which has a body having two main faces and at least one graphics element. A mold is provided having a mold cavity which defines the outside shape of the card body. A support element bearing a graphics element is placed in the mold cavity, and it is retained in place so that it remains substantially parallel to the walls of the mold cavity which define the main faces of the card body. A plastic material is then injected into the mold in such a manner that the plastic material occupies all of the space delimited in the mold cavity and not occupied by the support element. The part obtained in this way is then unmolded.

7 Claims, 5 Drawing Sheets

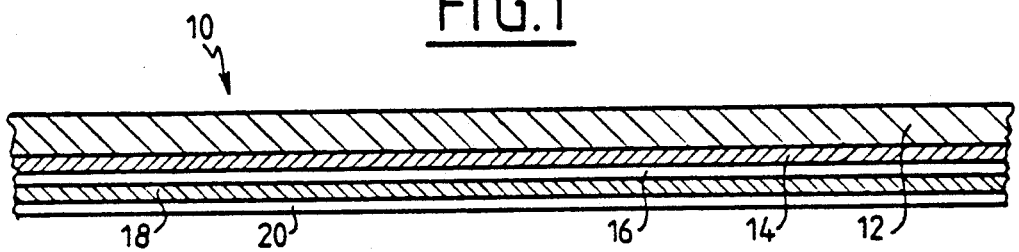
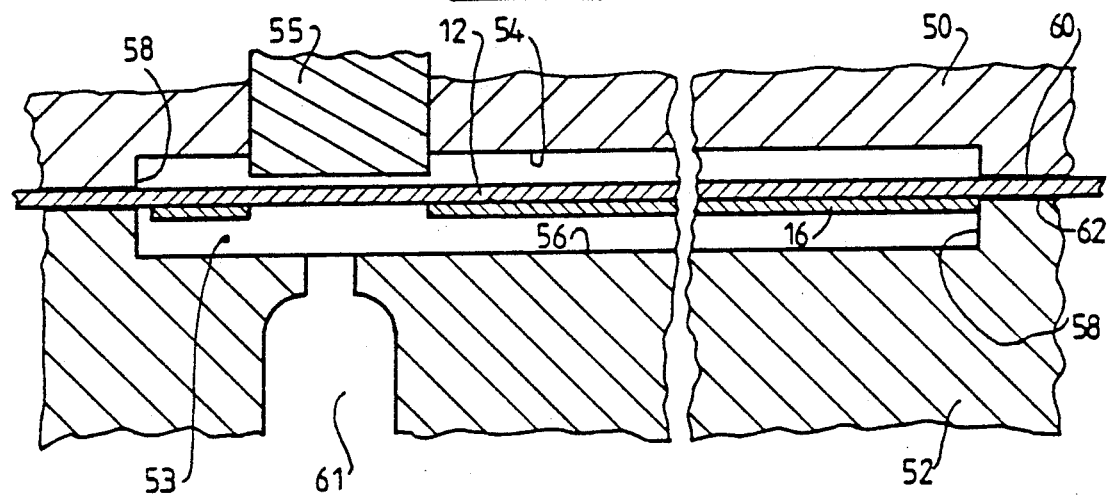
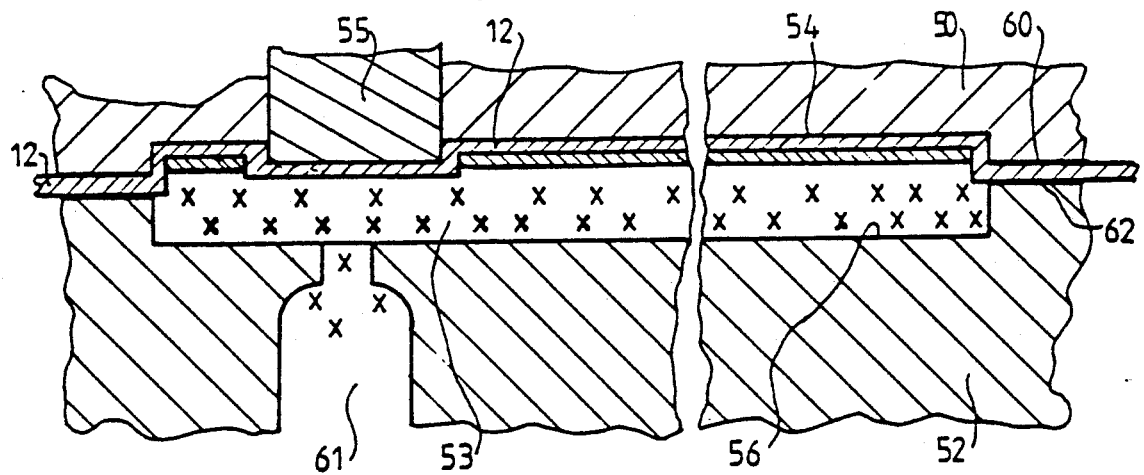

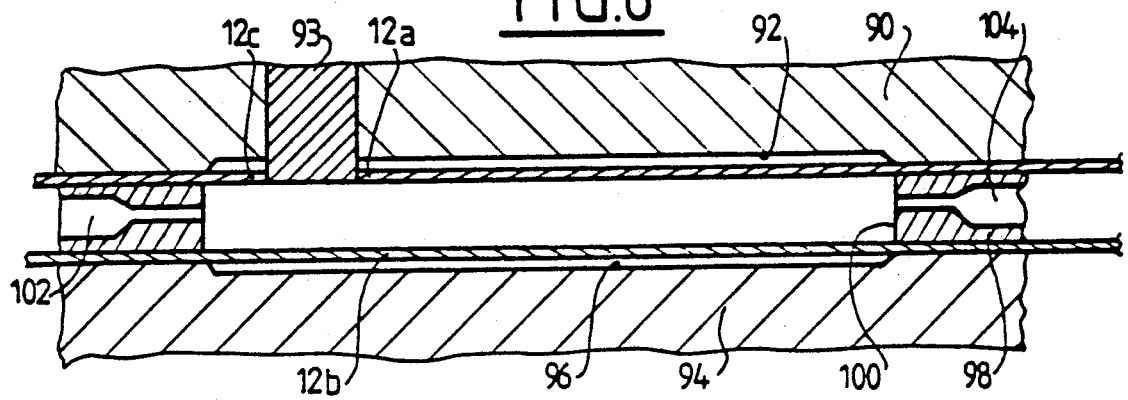
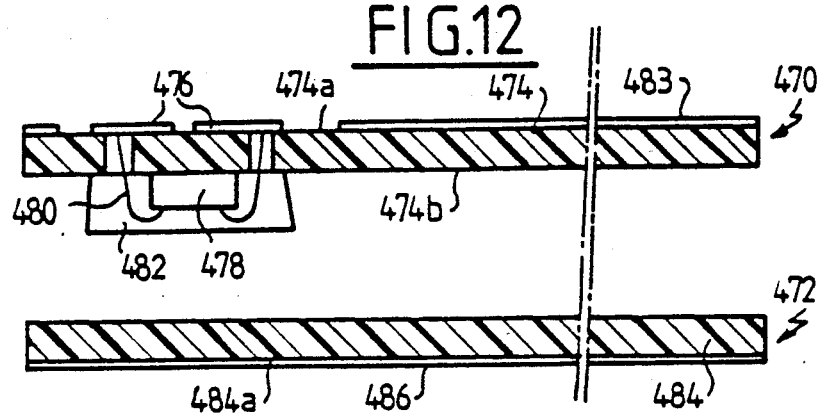
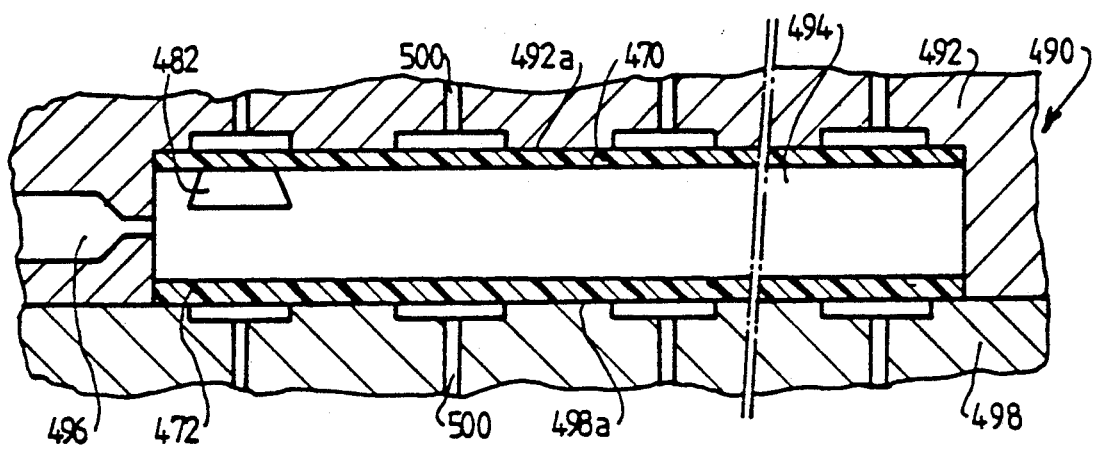

METHOD OF MAKING CARDS HAVING GRAPHICS ELEMENTS THEREON

The present invention relates to cards, in particular electronic memory cards, having a card body which includes graphics elements such as alphanumeric information or drawings for decorative or advertising purposes, for example.

BACKGROUND OF THE INVENTION

When the graphics element is fairly complicated, either by virtue of the shape of its outline or else because of the shades of color to be obtained, the stage during which the pattern is printed, e.g. by silkscreen printing, by offset printing, or by some other method, can lead to failure, particularly if high standards are required for the quality of the pattern and of the colors. In the event of failure, cards whose patterns are judged to be of inadequate quality must be rejected. This means that the materials, components, and machining costs of the card manufacturing stages prior to the stage during which the pattern is made, are all lost. These costs are particularly high if the pattern is made after an electronic module has already been implanted in the card body. This situation arises particularly, but not exclusively, when the card is manufactured by molding the card body directly over the electronic module using the technique described in French patent application number 87/00446.

According to this technique, an electronic module is put into place in a mold whose cavity defines the outside shape to be given to the card body. After unmolding, a memory card is obtained having a card body in its final shape and in which an electronic module is already implanted. If the result of a subsequent pattern-imparting step is unacceptable, it will then be understood that the entire cost of making the card is lost.

Proposals have also been made to make the card body by injection molding a plastic material. This technique is described in European patent application number 267 826. In order to reduce manufacturing costs, the injected material is preferably acrylonitrile-butadiene-styrene (ABS). This material suffers from the drawback of being poorly suited to making patterns on the faces of the card body by conventional printing techniques of silkscreen printing or offset printing.

In order to remedy these drawbacks, an object of the invention is to provide a method of manufacturing a card, in particular a memory card, in which the stage during which a pattern is formed on the card body cannot of itself give rise to the card being rejected or which makes it possible to form a pattern independently of the nature of the material used for manufacturing the card body.

SUMMARY OF THE INVENTION

In order to achieve this object, the present invention provides a method of making a card comprising a card body having two main faces and at least one graphics element, the method comprising the following stages:
(a) providing a mold having a mold cavity which defines the outside shape of the card body;
(b) placing at least one support element bearing a graphics element in the mold, and holding said support element in place so that it remains substantially parallel to the faces of the mold cavity which define the main faces of the card body;
(c) injecting a plastic material into said mold in such a manner that said plastic material occupies all of the space delimited in said mold cavity and not occupied by said support element; and
(d) unmolding the part obtained in this way.

In a first implementation, the graphics element of the support element includes print elements, and when the plastic material is injected into the mold, said print elements adhere to the face of the volume of injected plastic material which is in contact with said support element, and during unmolding, the support element is separated from the molded part, thereby leaving said print elements on said face of said body.

Preferably, during stage (b), an electronics module having an access face is disposed in said mold and said electronics module is held so that its access face is pressed against one of the main faces of the mold cavity, and during stage (c), the plastic material fills the entire space delimited by the cavity of said mold and not occupied by said support element and said electronics module.

In a variant of the first implementation, the graphics element of said support element comprises first and second print elements disposed on either side of an opaque intermediate layer, and the injected plastic material is transparent. Thus, the visual appearance is as though printing had been performed on each of the two main faces of the card body.

In a second implementation, said support is made of a non-transparent material provided on at least one of its faces with a graphics element, and said injected plastic material is transparent.

BRIEF DESCRIPTION OF THE DRAWINGS

Implementations of the invention are described by way of example with reference to the accompanying drawings, in which:

FIG. 1 is a vertical section through a support element provided with graphics elements in accordance with the first implementation of the invention;

FIG. 2a is a vertical view through a mold for making a memory card body using a FIG. 1 support element;

FIG. 2b is a similar view to FIG. 2a and shows the inside of the mold after the plastic material has been injected therein;

FIG. 4b shows an enlarged fragmentary view of the support element depicted in FIG. 4a;

FIG. 6 is a vertical section through a mold for implementing a second variant of the first implementation of the invention;

FIG. 12 is a vertical section through a plurality of support elements for making a card using a variant of the third implementation of the invention; and FIG. 13 is a vertical section through a mold suitable for performing the variant of the third implementation of the invention.

DETAILED DESCRIPTION

Figure 3:
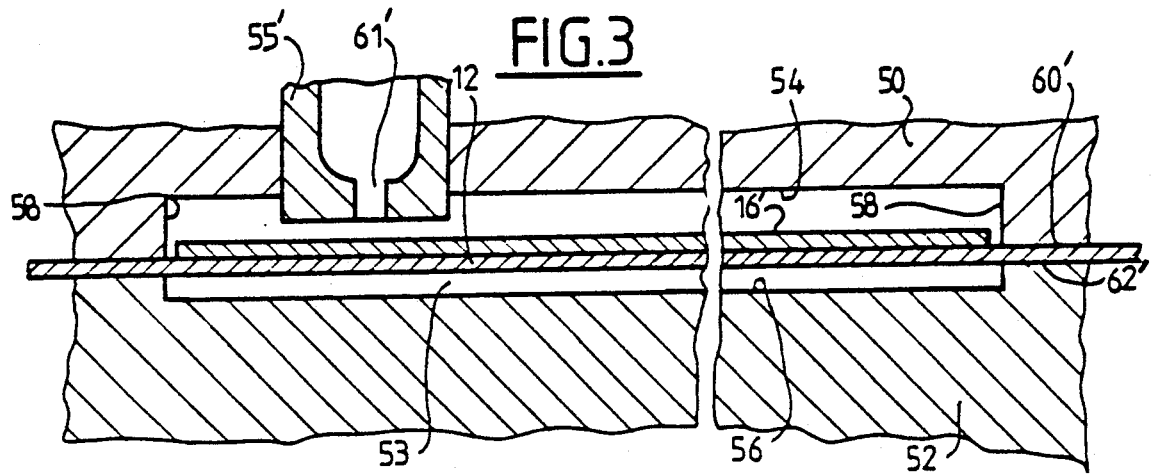
FIG. 3 is a vertical section through a variant mold suitable for use in the first implementation of the invention.

Prior to describing details of the invention as a whole, reference is made to FIG. 1 for describing a suitable print support element.

The support element is referenced 10 and comprises a support 12 or support sheet, made of plastic material. The support 12 is preferably made of polyester and is about 25 micrometers (μm) thick.

Print elements are provided on the support 12 which constitutes a mechanical support therefor, said print elements being subsequently used to obtain the desired pattern. Each print element is associated with a separation layer 14, a decorative layer 16 constituted by pigments, optionally a varnish layer 18, and an adhesive layer 20 which is about 1 μm to 2 μm thick.

A large number of identical marks may be made on a common support sheet 12. One such product is sold by the German company Leonard Kurz GmbH.

During the next stage, a card body is made by injection molding a plastic material, which material is preferably ABS. FIGS. 2a and 2b show the mold that is used. It comprises a fixed portion 50 and a moving portion 52. These two portions define a mold cavity 53 which imparts the outside shape to a card body. The fixed portion 50 has an inside wall 54 defining one of the main faces of the card body. The wall 54 includes a core 55 which projects into the cavity 53. The core 55 serves to define a void in the card body suitable for subsequently receiving an electronics module. The moving portion 52 has an inside wall 56 which defines the second main face of the card body and an inside wall 58 which defines the major portion of the edge of the card body. Each of the fixed and moving portions 50 and 52 includes a bearing surface 60 or 62, and these two bearing surfaces are normally in mutual contact when the mold is closed. Finally, the moving portion 52 includes an injection nozzle 61 opening out in the base 56 and disposed opposite the core 55.

When the mold is open, the strip constituted by the support 12 is placed between the fixed portion 50 and the moving portion 52 of the mold. The strip is located relative to the mold cavity 53 in such a matter that the pattern 16 carried by the support 12 is accurately positioned relative to the side wall 58 of the mold cavity, i.e. relative to the edge of the card body once the card has been made. In addition, the graphics elements 16 face towards the face 56 of the mold cavity 53. Thereafter the mold is closed. The support 12 is clamped between the bearing surfaces 58 and 60 of the two mold portions in that zone of the support 12 which surrounds a pattern. Plastic material is then injected into the mold cavity 53 via the injection nozzle 61. Preferably, ABS is injected at a temperature lying in the range 250° C. to 280° C. The plastic material fills the mold cavity 53 and presses the support 12 against the core 55 and the inside wall 54 of the mold, as shown in FIG. 2b. The plastic material fills the mold cavity 53 completely and it comes into contact with the pattern 16. Under the effect of pressure and temperature, the decorative elements 16 are fixed to the corresponding face of the volume of plastic material 62 and tend to separate from the support 12. This result is obtained by activating the adhesive layer 20 and the separation layer 14.

After opening the mold, the card body is unmolded therefrom including the desired pattern 16 on its main face, and the card body obtained in this way comes apart from the support 12.

Naturally, since the card body must be 0.8 mm thick, the thickness of the mold cavity (i.e. the distance between the faces 54 and 56) must be slightly greater than this value in order to leave room for the thickness of the support sheet 12.

FIG. 3 shows a mold for a second implementation of the invention. Like the mold shown in FIGS. 2a and 2b, this mold comprises a fixed portion 50 and a moving portion 52. Together these two portions define an internal cavity 53 which is substantially the same shape as is to be given to the card body. The fixed portion 50 defines the main face 54 and the side face 58 of the cavity 53. A core 55' projects through the main face 54 in order to define the shape of the void to be made in the card body. An injection nozzle 61' is disposed inside the core 55'. The moving portion 52 defines the second main face 56 of the mold cavity 53. The portions 50 and 52 have respective bearing surfaces 60' and 62' which come into contact with each other when the mold is closed. Bearing surface 62' is substantially in the same plane as the main face 56.

Figure 4B:
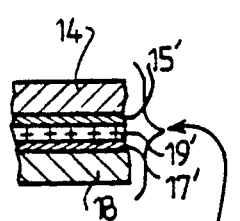
Figure 4A:
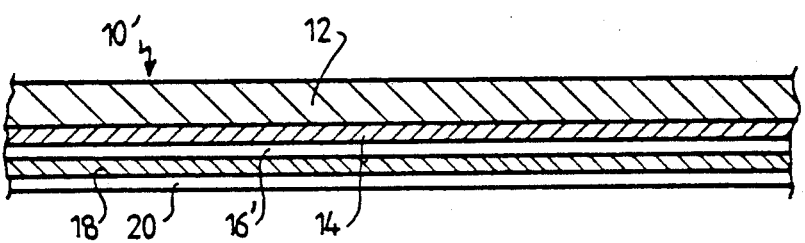
FIG. 4a shows a variant support element suitable for use with the mold of FIG. 3.

In order to implement the invention in accordance with FIG. 3, use is made of a support element 10' as shown in FIG. 4. It is identical to the support element 10 shown in FIG. 1 except for the decorative layer. The decorative layer 16' is constituted by two decorative sublayers 15' and 17' with an opaque intermediate layer 19' therebetween. As a result, the decorative layer 16' includes two different patterns disposed on opposite faces of the opaque intermediate layer.

The second implementation of the invention is performed as follows: The support element 10' is placed in the FIG. 3 between the fixed and moving portions 50 and 52. The mold is then closed and the periphery of the support sheet 12 is clamped between the mold portions which cut into the decorative element 16'. The decorative element 16' faces the main face of the cavity 53. A transparent or translucent plastic material is injected by the nozzle 61'. This material may be a polycarbonate or a transparent ABS, for example. While the mold cavity 53 is being filled, the decorative layer 16' becomes detached from the support sheet 12 and it adheres to the main face of the volume occupied by the plastic material. When the card body obtained in this way is unmolded and extracted, the support sheet 12 remains in the mold.

Figure 5:
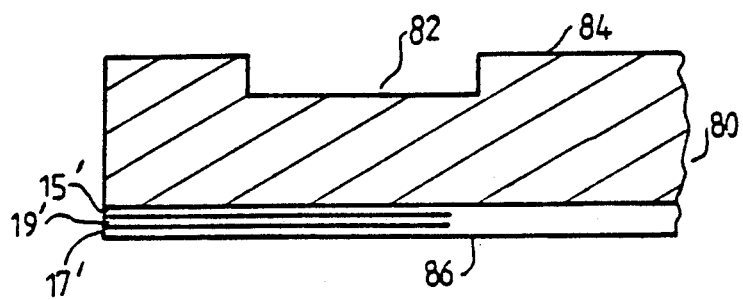
FIG. 5 is a fragmentary vertical section through a card body obtained by implementing the method as shown in FIGS. 3 and 4.

FIG. 5 shows the card body obtained in this way. The card body 80 with its void 82 opening out into its main face 84 is entirely transparent. The rear main face 86 is constituted by the decorative layer 16'. If the card body 80 is viewed from its front face 84, then the pattern formed by decorative sublayer 15' is seen. Otherwise, if the card body is viewed from its rear face 86, then the pattern defined by decorative sublayer 17' is seen directly. Given the small thickness of the card body (i.e.

0.8 mm), the optical effect due to the layer of transparent material is negligible.

FIG. 6 shows a variant mold suitable for making an electronic memory card having graphics elements on both of its main faces. The mold comprises three portions. A moving first portion 90 includes the portion 92 of the mold cavity which defines the first main face of the card body, including the core 93 for defining the void in the card body.

A moving second portion 94 includes the portion 96 of the mold cavity which defines the second main face of the card body. A fixed third portion 98 is sandwiched between the moving portions 90 and 94 when the mold is closed and includes the portion 100 of the mold cavity which defines the edge of the card body. The portion 98 of the mold includes, for example, two injection nozzles 102 and 104.

A card is manufactured using the FIG. 6 mold as follows: The mold is opened, i.e. both its moving portions 90 and 94 are moved away from its fixed portion 98. A first film 12a supporting print elements is placed between the portions 90 and 98 of the mold as already described with reference to FIG. 3. The support element 12a includes an opening 12c for receiving the core 93.

A second film 12b also supporting print elements is placed in the same manner between the portions 98 and 94 of the mold. The mold is then closed by clamping means (not shown in FIG. 6). In this way, the support films 12a and 12b are both fixed to the mold since each of them is clamped between the fixed portion 98 and a corresponding one of the moving portions 90 and 94 of the mold. Plastic material is then injected into the mold via the nozzles 102 and 104 and the card obtained in this way is unmolded leaving the support films 12a and 12b behind in the mold so that only the graphics elements formed by the decorative layers thereon remain fixed to the main faces of the card body.

In all of the variants of the first implementation of the invention as described above, the pattern on the card body is obtained by transferring a decorative layer during molding from the support sheet of the print support element onto the plastic material which constitutes the card body.

In a second implementation of the invention, it is also possible to provide the pattern by means of a print support element which constitutes a "label". In other words, it is the entire assembly constituted by the support sheet and the decorative layer which adheres to the plastic material after the material has been injected into the mold.

Figure 7A:
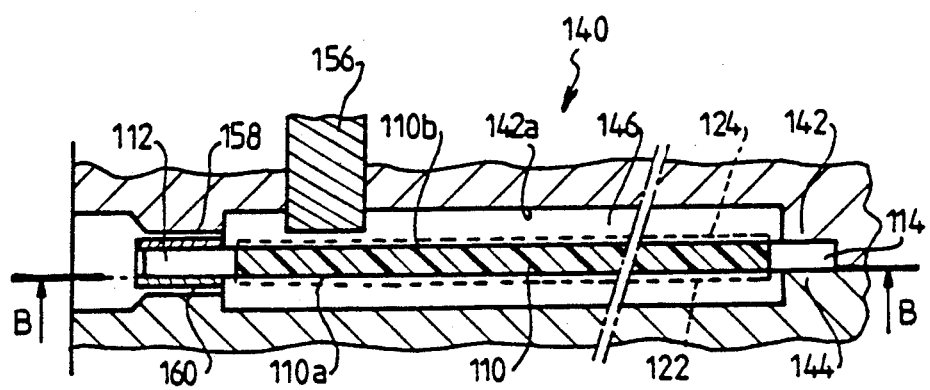
FIGS. 7a and 7b are respectively a vertical section and a plan view of a mold for implementing a second implementation of the invention.
Figure 7B:
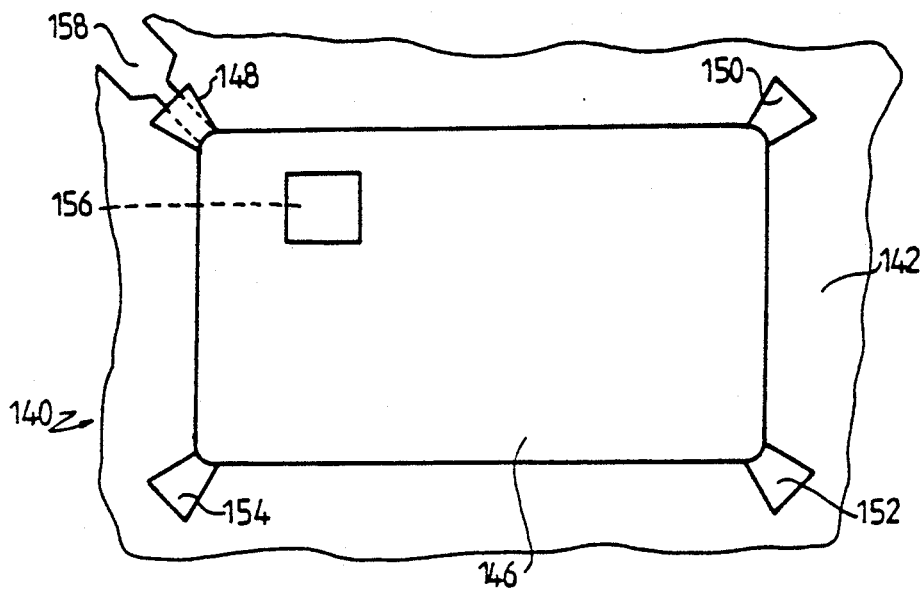

FIGS. 7a and 7b illustrate this second way of applying a pattern to a card.

The support element is constituted by a piece 110 of plastic sheet material which has the same general shape as the main faces of the card body, i.e. it is rectangular. The support element also includes four extensions, each of which extends from a corresponding vertex of the support element, per se. Only the extensions 112 and 114 can be seen in FIG. 7a. The support element 110 is cut out from a sheet of polycarbonate, for example, with the sheet having a thickness of about 0.1 mm. The desired patterns referenced 122 and 124 in FIG. 7a are made by any appropriate means on the two faces 110a and 110b of the support element, or alternatively on one of the faces only. Naturally, patterns corresponding to a large number of support elements are printed simultaneously on a single sheet of polycarbonate and the supports elements 10 are subsequently cut out from the sheet in order to obtain the shape shown in the figures.

FIGS. 7a and 7b show a mold shape suitable for use in making an electronic memory card body using the support element 110. The mold 140 comprises two portions 142 and 144 which together define a mold cavity 146 defining the outside shape of the body of the card to be made. The portion 142 of the mold also includes voids 148 to 154 corresponding to the extensions of the support element 110. The main face 142a of the cavity 146 includes a core 156 which projects into the cavity 146 in order to define a void in the card body for receiving the electronic module. The mold 140 also includes two injection ducts 158 and 160 belonging to the portions 142 and 144 respectively of the mold and opening out into one of the "corners" of the mold cavity 146.

The card is made as follows. The support element 110 is placed in the portion 142 of the mold 140. More precisely, the extensions of the support element are disposed in the cavity 148 to 154. The portion 144 of the mold is then fixed on the portion 142.

The support element 110 is thus positioned and fixed to the mold by its extensions such as 112 and 114. The element 110 divides the cavity 146 into two half-cavities. Plastic material is then injected via each of the injection channels 158 and 160 so as to form the card body inside the mold cavity 146 on either side of the element 110. The injected plastic material is transparent and is suitable for adhering to the material constituting the support element 110. It is preferable to use polycarbonate for this purpose as well. During injection, the plastic material fills that portion of the mold cavity 146 which is not occupied by the support 110, thereby defining the card body. Thereafter, the part made in this way is unmolded by separating the portions 144 and 142 of the mold. Finally, the "corners" of the card body are cut out so as to give them the appropriate rounded shape and so as to get rid of the extensions such as 112 and 114, and also to get rid of the injection "sprues".

After the cutting-out operation, a card body of transparent material is obtained having the support elements embedded therein. Since the plastic material of the card body is transparent, the graphics elements, drawings, or alpha-numeric indications remain visible as in a card made by a prior method. In addition, the pattern is protected by the transparent plastic material.

Other transparent moldable plastic materials could be used instead of polycarbonate, e.g. moldable transparent polyesters or transparent polysulfones. It would also be possible to use crystal polystyrene or acrylonitryl styrene.

In a first variant of this second implementation of the invention, the support element 110 is larger than the main faces of the card body and the extensions are omitted. The support element is put into place in the mold. When the mold is closed, the periphery of the support element is clamped between the portions 142 and 144 of the mold. After unmolding, the periphery of the support element which projects from the card body must be cut off.

Figure 8:
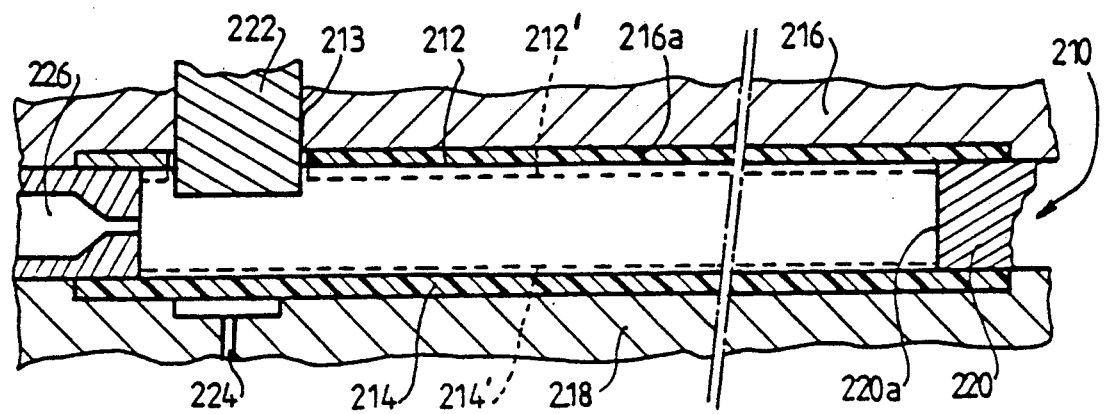
FIG. 8 is a vertical section through a mold for performing a variant of the second implementation of the invention.

FIG. 8 shows another embodiment of a mold 210 for use in the second implementation of the method of the invention. In this variant, the front and back graphics elements 212 and 214 including patterns 212' and 214' are similar to the support element 110 shown in FIG. 7. However they are larger in size than the main faces of the card body. The mold 210 comprises three portions: a front portion 216 defining main face 216a of the card body; a rear portion 218 defining the rear main face 218a of the card body; and an intermediate portion 220 which defines the side wall 220a of the card body and the card thickness. Mold portions 216 and 218 preferably include suction systems such as 224 in order to hold the support elements more securely in place. In addition, mold portion 216 includes a core 222 for defining the void to be formed in the card body.

A card is made as follows. When the mold is open, the support element 212 is put into place against the face 216a of the mold. The support element 212 includes an opening 213 for passing the core 222. The intermediate portion 220 is then put into place with the periphery of support element 212 being clamped between mold portions 212 and 220. Thereafter support element 214 is put into place and suction systems 224 are switched on. Finally, mold portion 218 is put into place with the periphery of support element 214 being clamped between the intermediate portion and mold portion 218. Plastic material is then injected into the mold via injection channel 226.

In the above description with reference to FIGS. 7 and 8, it is assumed that the support elements and their patterns are cut out prior to being put into place in the mold. However, when the support element is held in place in the mold by having its periphery clamped between two mold portions, it is clear that the support elements could be left in strip form. The strip would then be displaced by one step prior to each card molding operation so that one support element (or two support elements for the case shown in FIG. 8) is presented to the mold cavity prior to each molding operation, and while the mold cavity is open.

Using the various implementations of the method as described above, card bodies are obtained each including a pattern on one or both main faces and each including a void for receiving the electronics module. The electronics module is subsequently fixed inside the void by any appropriate technique, e.g. by one of the techniques described in European patent applications numbers 197 847 and 254 640.

In a third implementation of the invention, a card is obtained directly with its electronic module and with patterns formed on one or both of the main faces of the card. This third implementation consists in causing the sheet supporting the graphics element to perform two functions, i.e. it not only supports the decorative layers for constituting the patterns, it also serves as a temporary support and as a positioning means for holding the electronics module in the injection mold. Thus, the electronics module is embedded (apart from its access face) in the plastic material constituting the card body.

This technique can be applied to all of the implementations described above. Only two particular examples of this third implementation are therefore described.

Figure 9:
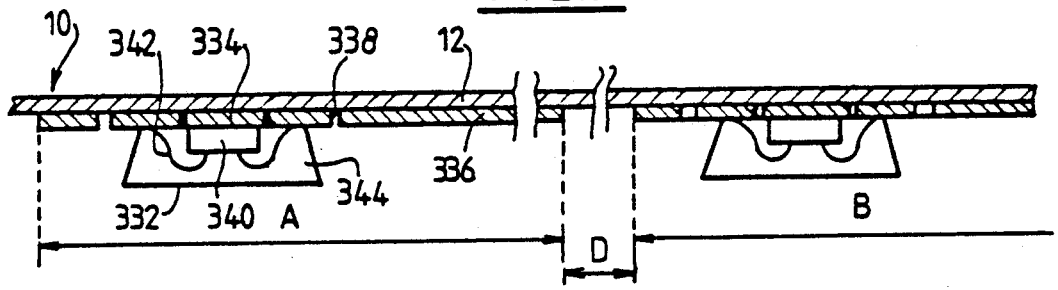
FIG. 9 is a vertical section through a support element provided with electronics modules.
Figure 10:
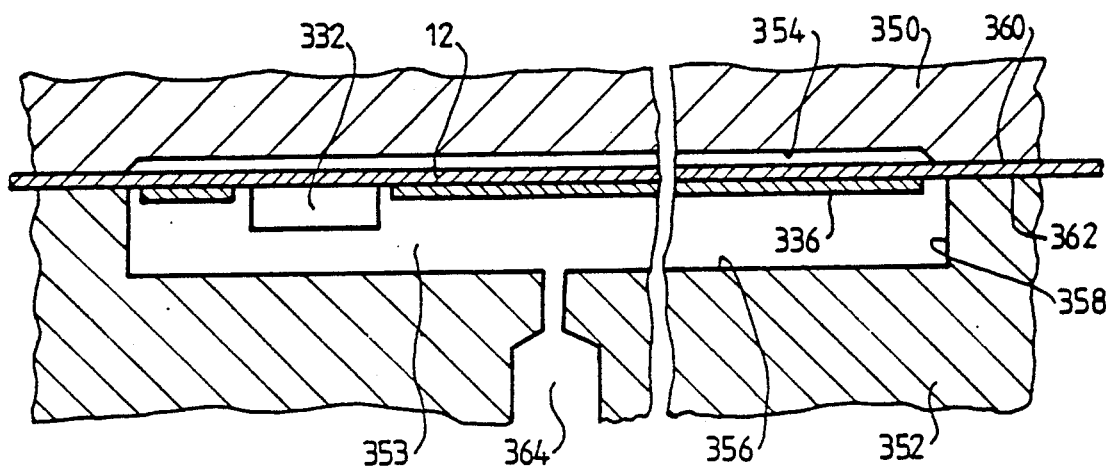
FIG. 10 is a vertical section through a mold for making use of the FIG. 9 support element in a third implementation of the invention.
Figure 11:
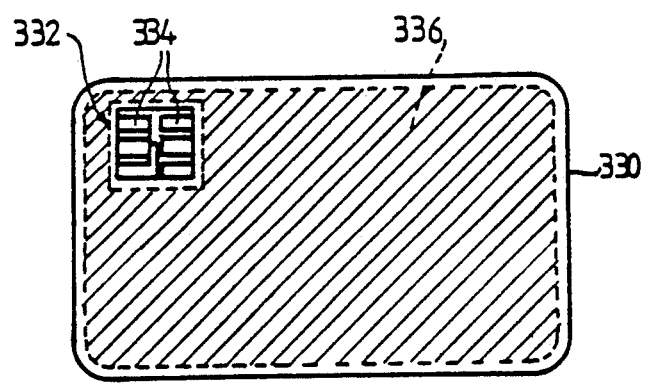
FIG. 11 is a plan view of an electronic memory card obtained using the third implementation of the invention.

With reference now to FIGS. 9 to 11, a first way of making electronic memory cards in accordance with the invention is described.

This method is based on a support element 10 including a plurality of identical patterns, with each pattern corresponding to all of the printing that is to appear on one of the faces of the card body. FIG. 9 shows patterns A and B. Each pattern is separated from the adjacent pattern by a blank space whose use is described below.

FIG. 11 shows a card body 330 made in accordance with the invention. The visible main face of the card body includes an electronics module 332 of which only the external electrical contact tabs 334 can be seen. Reference 336 designates the area of the card body which may include a pattern. The zone 336 leaves blank that portion of the face of the card body 330 which is occupied by the external electrical contact tabs 334.

Returning to FIG. 9, it can be seen that for each pattern, the zone where patterns 336 are formed leaves a blank portion 338 of the plastic support 12 where the electronics module 332 is to be located in the final card.

The electronics module 332 comprises a lead frame or a printed circuit element on which the external tabs 334 are formed, together with a semiconductor chip 340 fixed to the printed circuit or the lead frame and conductor wires 342 interconnecting the chip 340 and the contact tabs 334. In addition, the chip 340 and the wire 342 are embedded in a coating material 344. A module 332 is stuck to the support 12 in each location 338, such that each card-sized pattern includes one module.

As shown in FIG. 9, the outside faces of the external contact tabs are stuck directly to the support 12.

A strip is thus constituted which is formed by the support 12 which has a plurality of card-sized patterns (A, B, . . . ) on one of its faces, with each pattern additionally including an electronics module 332.

In the next stage, the card body is made by injecting plastic material, and preferably ABS. FIG. 10 shows the mold that is used. It comprises a fixed portion 350 and a moving portion 352. These two portions define a mold cavity 353 which defines the outside shape of the card body. The fixed portion 350 has an inside wall 354 which defines one of the main faces of the card body. The moving portion 352 has an inside face 356 which defines the other main face of the card body and has an inside 358 which defines the edge of the card body. Each of the fixed and moving portions 350 and 352 includes a respective bearing surface 360 or 362 and these two bearing surfaces are normally in mutual contact when the mold is closed.

While the mold is open, the strip constituted by the support 12 is placed between the fixed portion 350 and the moving portion 352 of the mold. The strip is positioned relative to the mold cavity 353 in such a manner that the pattern carried by the support 12 (and consequently the electronics module 332 also) is accurately positioned relative to the side wall 358 of the cavity, i.e. relative to the edge of the card body to be manufactured. The mold is then closed. The support 12 is clamped between the bearing surfaces 358 and 360 of the two mold portions in the zone B of the support 12 surrounding any one pattern. Plastic material is then injected into the cavity 353 via the injection nozzle 364, and preferably ABS is injected at a temperature laying in the range 220° C. to 280° C. Preferably, the nozzle 364 is disposed in the middle of the wall 356 of the moving part 352. The plastic material fills the cavity 353 and presses the support 12 against the inside wall 354 of the mold. The plastic material surrounds the electronics module 332 apart from its face which is struck to the support 12, and it also comes into contact with the pattern 336. Under the effects of pressure and temperature, the decorative elements 336 are fixed to the corresponding face of the volume of plastic material and they tend to separate from the support 12. This result is obtained by activating the adhesive layer 20 and the separation layer 14.

If the electronics module 332 is sufficiently thin compared with the thickness of the card, it is possible to provide an injection nozzle 364 which opens out into the face 356 of the mold facing the electronics module.

It is also possible to provide a plurality of injection nozzles. Indeed, it is possible to provide injection nozzles in the side face 358 of the mold cavity, in which case it is preferable for the nozzles to be disposed in some of the "corners" of the mode cavity.

After opening the mold, the card body is unmolded together with the included electronics module 332 and the desired pattern 336 on its main face.

It will be understood that the support 12 performs two functions: firstly it makes it possible to provide the desired pattern; and secondly it ensures that the electronics module is accurately positioned relative to the mold cavity and thus relative to the card body. In addition, since the external tabs of the electronics module are glued to the support 12, they are protected against being unintentionally covered by the injected material.

The support 12 which no longer carries either the electronics module or the patterns remains inside the mold after the card has been removed.

Reference is now made to FIGS. 12 and 13 while describing a second example of the third implementation of the invention. In this second example, two support elements each corresponding to a respective one of the main faces of the card body are put into place prior to the plastic material being injected.

FIG. 12 shows the front support element 470 and the rear support element 472. The front support element 470 also constitutes the insulating support for the electronics module. The front support 470 is constituted by a rectangular sheet 474, e.g. of ABS, and it has the same shape as the main faces of the card to be made. The sheet 474 includes metallization 476 in an appropriate zone of its outside face 474a to constitute the external electrical contact tabs of the card. A semiconductor chip 478 is fixed to the inside face 474b of the support 474 and wires 480 provide electrical connection between the terminals of the semiconductor chip 478 and the external tabs 476. The chip 478 and the wires 480 are preferably embedded in an insulating material 482.

Prior to fixing the chip 478, graphical printing 483 is performed on the outside face 474a of the sheet in those portions thereof which are not occupied by the metallization 476.

The rear support element 472 is likewise constituted by a portion of plastic sheet 484 having the same dimensions as the rear main face of the card body. The required printing 486 is performed on the outside face 484a of the sheet 484.

FIG. 13 is a vertical section through a mold 490 suitable for use in making a card in accordance with this second example of the third implementation of the invention. The mold 490 comprises a first portion 492 which defines a cavity 494 having the outside shape of the card body to be made. Mold portion 492 includes a plurality of suction systems 500 opening out into the main face 492a of the cavity 494. It also includes an injection channel 496 opening out into a "corner" of the cavity 494. The second portion 498 of the mold 490 defines the second main face 498a of the card body. A plurality of suction systems 500 open out into the face 498a of mold portion 498.

A memory card is manufactured in accordance with this second variant of the third implementation of the invention, as follows: The front support element 470 also including the electronics module is put into place against the front face 492a of the portion 492. The suction systems are switched on, thereby firmly securing the element 470 against the face 492a. Similarly, the rear support 472 is put into place against the face 498a of the portion 498 of the mold 490 and the suction systems 500 are likewise switched on to hold the support element 472 against the face 498a. The mold is then closed by fixing together the portion 498 and the portion 492. An appropriate plastic material is injected via the injection channel 498 and fills the cavity 494, adhering against the inside faces of the support elements 470 and 472. The injected material is preferably the same as the material constituting the support elements 470 and 472.

Thereafter the mold 490 is opened and the part manufactured therein is removed. A memory card is thus made which includes graphics elements on both of its main faces, which graphics elements are made on the support elements prior to the card per se being made.

We claim:

1. A method of making a card comprising a card body having two mutually substantially parallel main faces and at least one print element, the method comprising the steps of:
   providing a mold whose mold cavity defines the outside shape to be given to the card body, and including two flat walls for defining said two faces of the card body;
   maintaining a support element in said mold cavity, said support element having two mutually parallel surfaces being disposed substantially parallel to said two faces of the mold cavity, said support element having print elements on at least one of its two surfaces for defining a pattern to be formed on at least one of the two main faces of the card body;
   injecting a plastic material into said mold so that (a) the plastic materials fills said mold cavity, (b) said print elements adhere to a face of the injected plastic material which comes into contact with said support element, and (c) a surface of said support element is forced flat against one of the two walls of the mold cavity to thereby form one of the two faces of the card body with the support element; and
   unmolding the part obtained in this way and separating the support element from said part, thereby leaving said print elements on said one face of said card body.

2. A method according to claim 1, in which the print elements comprise pattern elements fixed on said support by means of a separation layer and in which a face of the pattern elements not facing said support element is covered in a heat-activated adhesive material.

3. A method according to claim 2, in which the injected plastic material is acrylonitrile-butadiene-styrene.

4. A method according to claim 2, in which the print elements include pattern elements constituted by two decorative layers having an opaque intermediate layer interposed therebetween, and in which the injected plastic material is transparent.

5. A method according to claim 4, in which said mold includes means projecting from one of said flat walls for providing a void in said one of the two faces of said card body, and said method further comprising the step of maintaining said support element in said mold cavity in the vicinity of the other flat wall of the mold cavity which defines the other of the two faces of the card body.

6. A method of making a card comprising a card body having two mutually substantially parallel main faces and at least one graphics element, comprising the steps of:
- (a) providing a mold having a mold cavity which defines the outside shape of the card body, and including two flat walls for defining said two main faces of a card body;
- (b) placing in the mold cavity a support element having two mutually substantially parallel surfaces at least one of which bears at least one graphics element, and maintaining said support element in place adjacent one of said two walls of said mold cavity;
- (c) injecting a plastic material into said mold cavity so that said plastic material occupies all fo the space delimited in said mold cavity and not occupied by said support element, to adhere said plastic material to said support element, and to force one of the surfaces of the support element flat against said one of said two walls of the mold cavity to thereby form one of said two faces of the card body with the support element;
- (d) unmolding the part obtained in this way to obtain a card body having said at least one graphics element on said one of the two faces of the card body formed by said support element; and wherein one of the two flat walls of the mold cavity has a protrusion extending into the mold cavity for defining a void in the card body, wherein said support element is placed within said mold cavity and maintained closer to the other flat wall of the mold cavity, said support element being made of a nontransparent material and being provided with a graphics element on each of its two surfaces, and wherein said injected plastic material is transparent.

7. A method according to claim 6 wherein the distance between the two flat walls of the mold cavity is about 0.8 mm.

* * * * *